United States Patent
Lian et al.

(10) Patent No.: US 10,529,572 B2
(45) Date of Patent: Jan. 7, 2020

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Jian-Jou Lian, Tainan (TW); Li-Min Chen, Zhubei (TW); Neng-Jye Yang, Hsinchu (TW); Ming-Hsi Yeh, Hsinchu (TW); Shun Wu Lin, Taichung (TW); Kuo-Bin Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/966,970

(22) Filed: Apr. 30, 2018

(65) Prior Publication Data

US 2019/0333770 A1    Oct. 31, 2019

(51) Int. Cl.
| | |
|---|---|
| *H01L 21/28* | (2006.01) |
| *H01L 29/66* | (2006.01) |
| *H01L 21/3213* | (2006.01) |
| *H01L 21/02* | (2006.01) |
| *H01L 29/08* | (2006.01) |
| *H01L 29/78* | (2006.01) |
| *H01L 29/165* | (2006.01) |
| *H01L 29/267* | (2006.01) |

(52) U.S. Cl.
CPC .. *H01L 21/28247* (2013.01); *H01L 21/02521* (2013.01); *H01L 21/02532* (2013.01); *H01L 21/32134* (2013.01); *H01L 29/0847* (2013.01); *H01L 29/165* (2013.01); *H01L 29/267* (2013.01); *H01L 29/66545* (2013.01); *H01L 29/66636* (2013.01); *H01L 29/66795* (2013.01); *H01L 29/7848* (2013.01); *H01L 29/7851* (2013.01)

(58) Field of Classification Search
CPC ......... H01L 21/28247; H01L 21/02521; H01L 29/267; H01L 29/165; H01L 29/7848; H01L 29/7851; H01L 29/0847; H01L 21/02532; H01L 21/32134; H01L 29/66545; H01L 29/66795; H01L 29/66636
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2013/0196497 A1* | 8/2013 | Shimada | C09K 13/06 438/591 |
| 2013/0200470 A1* | 8/2013 | Liu | H01L 29/66795 257/408 |
| 2014/0282326 A1 | 9/2014 | Chen et al. | |

(Continued)

*Primary Examiner* — Yasser A Abdelaziez
(74) *Attorney, Agent, or Firm* — Slater Matsil, LLP

(57) ABSTRACT

An etchant is utilized to remove a semiconductor material. In some embodiments an oxidizer is added to the etchant in order to react with surrounding semiconductor material and form a protective layer. The protective layer is utilized to help prevent damage that could occur from the other components within the etchant.

21 Claims, 7 Drawing Sheets

(56) References Cited

U.S. PATENT DOCUMENTS

2016/0200975 A1* 7/2016 Cooper .................. C09K 13/06
                                                    252/79.1
2016/0343605 A1* 11/2016 Kelly ................ H01L 29/66795
2018/0171226 A1* 6/2018 Yang ...................... C09K 13/02

* cited by examiner

SEMICONDUCTOR DEVICE AND METHOD OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
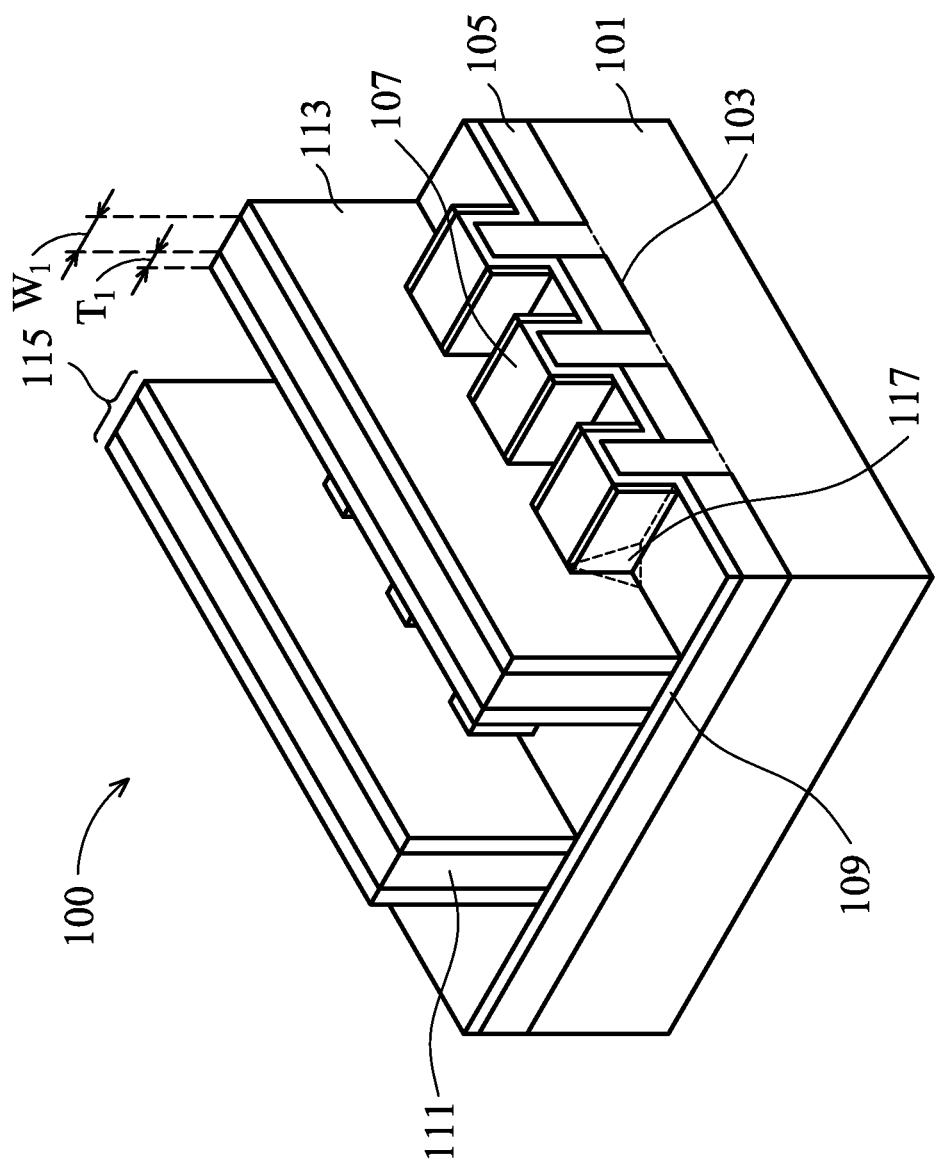
FIG. 1 illustrates a formation of a dummy gate electrode over a semiconductor fin, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a replacement gate fin field effect transistor (FinFET) in a sub-10 nm process node. Other embodiments, however, are not limited to this, and the embodiments discussed herein may be applied in a wide variety of ways and structures.

With reference now to FIG. 1, there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 may be formed to have a thickness of between about 50 Å and about 10 Å, such as about 25 Å. However, any suitable thickness may be utilized.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 may be etched using a dry etching process to form the patterned stacks 115.

In an embodiment the patterned stacks 115 may be patterned to have a first width $W_1$ that allows for an efficient subsequent removal of the dummy gate electrode 111 and replacement with a gate electrode. As such, while the precise widths may depend at least in part on the overall design of the device, the first width $W_1$ may be between about 100 Å and about 10 Å, such as about 40 Å. However, any suitable dimension may be utilized.

Additionally, while the dummy gate electrode 111 is being patterned, a gate electrode foot 117 (e.g., a poly-foot) may result. In particular, the variations in etching that may occur given the shape of the fins 107 and the process variations, a portion of the material of the dummy gate electrode 111 may unintentionally remain behind and bridge a corner between the dummy gate dielectric 109 over the fins 107 and a remainder of the material of the dummy gate electrode 111. With this gate electrode foot 117, a subsequent spacer material (described further below) may be displaced, thereby allowing for potential diffusion of subsequently applied etchants towards the fins 107.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ that can help to protect subsequently formed source/drain regions (not illustrated in FIG. 1 but illustrated and discussed below with respect to FIG. 2A) but are still small enough to allow for a reduction in size of the overall device. As such, in some embodiments, the first thickness $T_1$ may be between about 70 Å and about 30 Å, such as about 45 Å. However, any suitable thicknesses may be utilized.

Figure 2A:
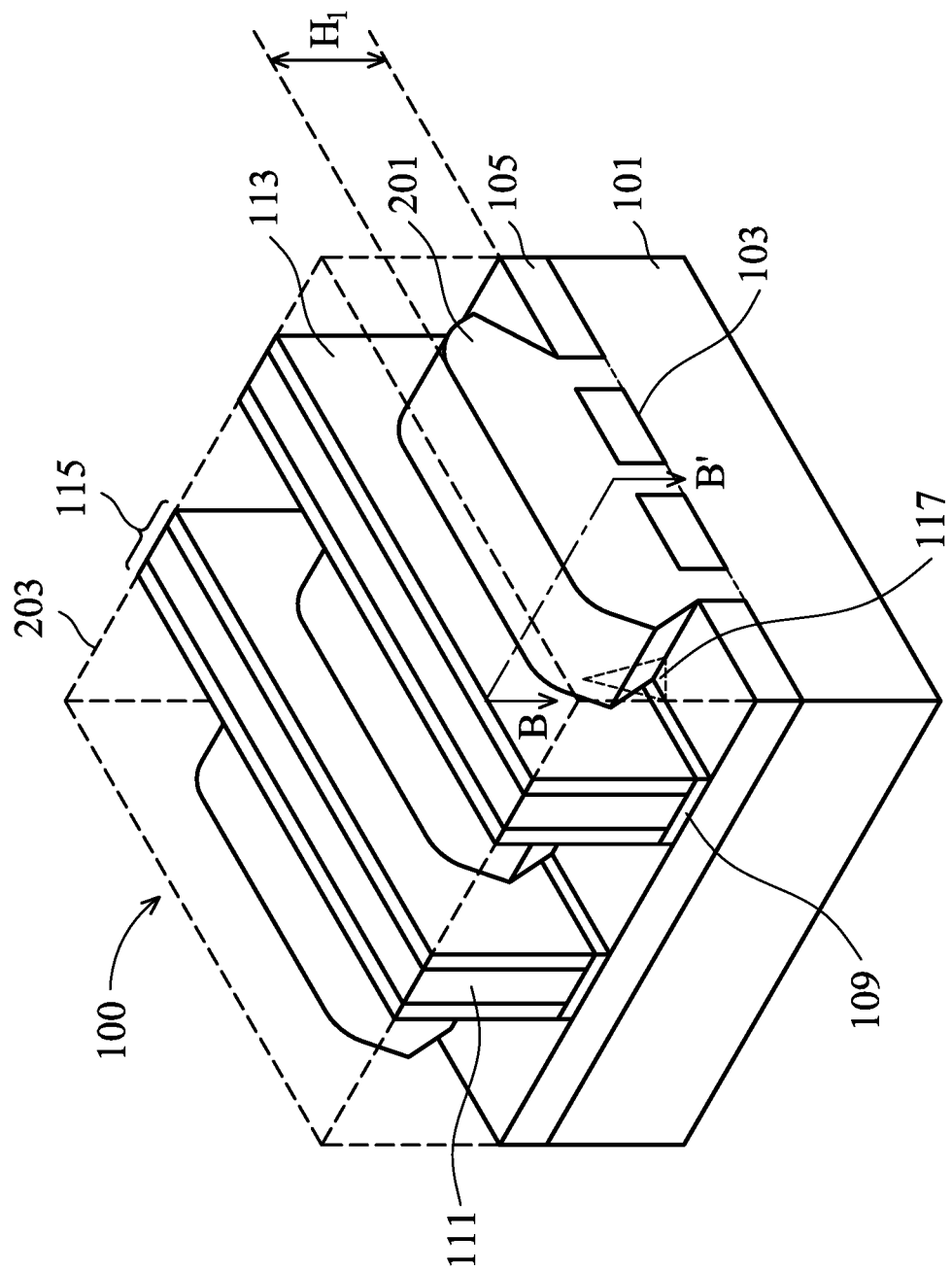
FIGS. 2A-2B illustrate a formation of source/drain regions, in accordance with some embodiments.
Figure 2B:
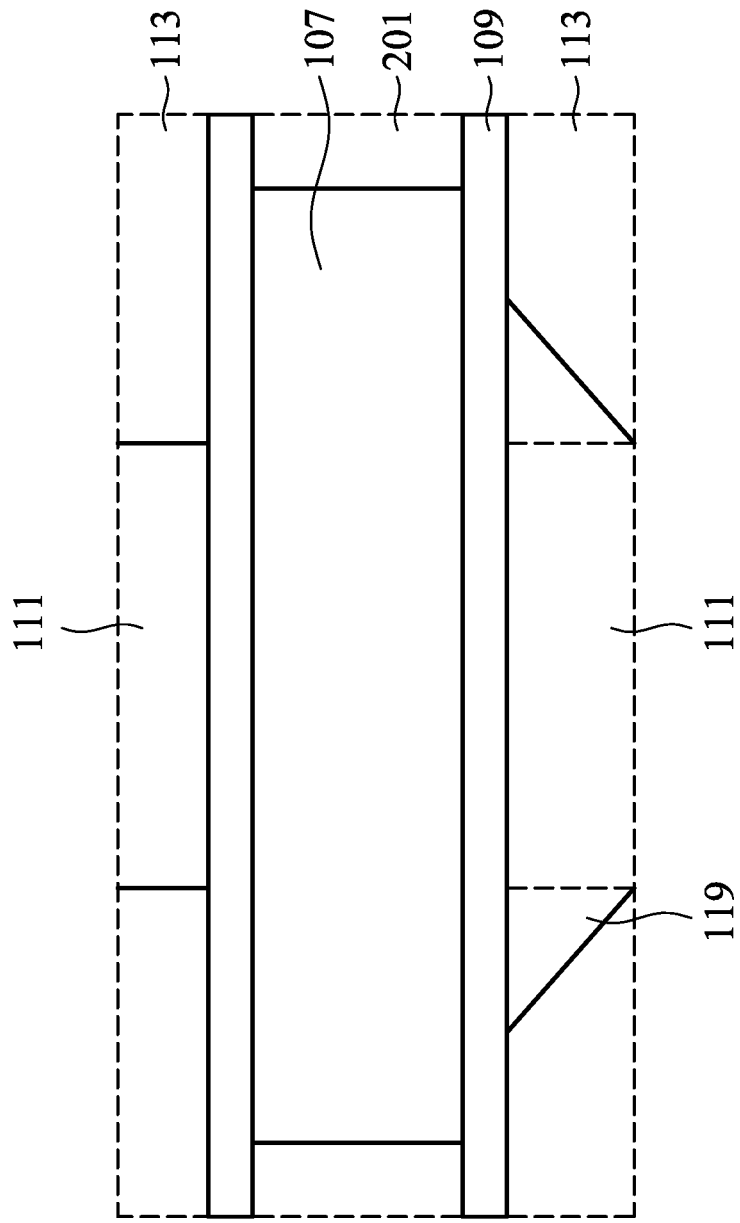

FIGS. 2A-2B illustrate a removal of exposed portions of the dummy gate dielectric 109 and the fins 107 from those areas not protected by the stacks 115 and the first spacers 113 and a regrowth of source/drain regions 201 (with FIG. 2B illustrating a top down view of FIG. 2A along line B-B'). In an embodiment the exposed portions of the dummy gate dielectric 109 may be removed using any suitable means, such as a wet etch or dry etch with etchants selective to the material of the dummy gate dielectric 109 in order to expose the material of the underlying fins 107. However, any suitable method of removal may be utilized.

The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as doped silicon (e.g., silicon phosphorous (SiP)) or else a material such as silicon germanium that has a different lattice constant than the channel regions. In other embodiments the source/drain regions 201 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å, and may have a first height $H_1$ over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2A also illustrates a formation of an inter-layer dielectric (ILD) layer 203 (illustrated in dashed lines in FIG. 2A in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3A:
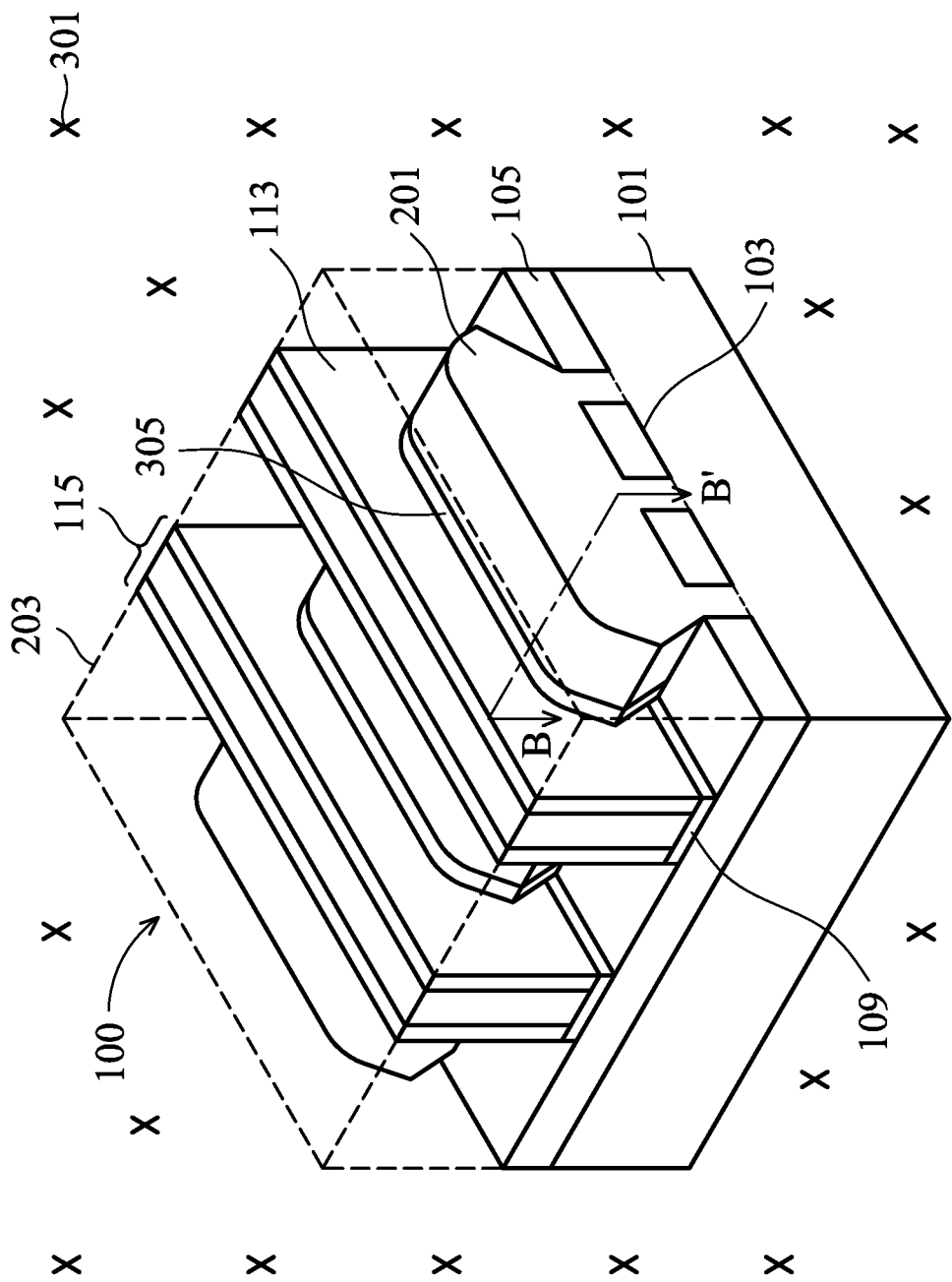
FIGS. 3A-3B illustrate a removal of the dummy gate electrode, in accordance with some embodiments.
Figure 3B:
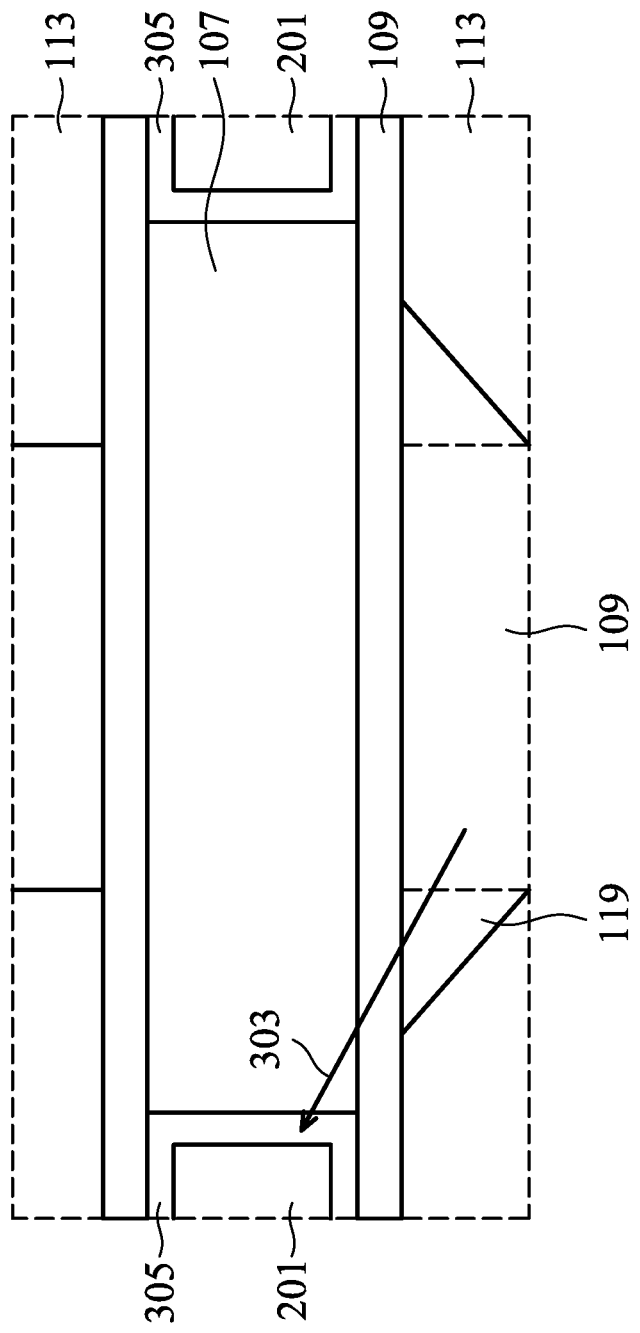

FIGS. 3A-3B illustrate a removal of the dummy gate electrode 111 from between the first spacers 113. In an embodiment the removal of the dummy gate electrode 111 may be performed using, e.g., a wet etching process that utilizes an wet etching solution (represented in FIG. 3 by the "X"s labeled 301) that can both remove the material of the dummy gate electrode 111 (e.g., silicon) as well as help to protect the source/drain regions 201 (which have been formed using an epitaxial process).

In an embodiment the wet etching solution 301 comprises a solvent, an etchant, a selective oxidizer, and a wetting component. In an embodiment the solvent is utilized as a mixing and delivery system, enabling the efficient placement and removal of the wet etching solution 301 so that the wet etching solution 301 contacts the dummy gate electrode 111 while still allowing for protection of the surrounding materials (e.g., the oxides). For example, the solvent may be a bulky glycol molecule, such as ethylene glycol, diethylene glycol, triethylene glycol, ethylene glycol butyl ether, carbitol, combinations of these, or the like. However, any suitable solvent may be utilized.

In addition to the solvent, the wet etching solution 301 may also comprise a non-hydrocarbon solvent in order to assist in placement of the wet etching solution 301. In an embodiment the non-hydrocarbon solvent may be comprise water, such as deionized water, such as ultra-pure deionized water. However, any suitable non-hydrocarbon solvent may be utilized.

The etchant is utilized to actually remove the material of the dummy gate electrode in (e.g., silicon). In a particular embodiment a multi-component alkali utilizing both a strong alkali and a weak alkali may be utilized. For example, the strong alkali may be an alkali such as tetramethylammonium hydroxide (TMAH), ammonium hydroxide (NH$_4$OH), potassium hydroxide (KOH), combinations of these, or the like, which will dissociate in the solvent or the non-hydrocarbon solvent in order to generate OH$^-$ ions. However, any suitable strong etchants may be utilized.

In a particular embodiment in which either tetramethylammonium hydroxide or ammonium hydroxide disassociate to provide OH$^-$ ions, the OH$^-$ ions will react with the material of the dummy gate electrode 111 (e.g., silicon) in order to remove the material of the dummy gate electrode 111. In a particular embodiment in which the material of the dummy gate electrode 111 is silicon, the silicon will react with the OH$^-$ ions and the non-hydrocarbon solvent (e.g., water) within the wet etching solution 301 according to the following oxidation and reduction reactions:

$$Si+2OH^- \rightarrow Si(OH)_2^{2+}+4e \qquad \text{Eq. 1}$$

$$Si(OH)_2^{2+}+4H_2O+4e \rightarrow Si(OH)_6^{2-}+2H_2 \qquad \text{Eq. 2}$$

By utilizing the strong alkali component of the etchant, the exposed material of the dummy gate electrode 111 can be removed.

However, the use of a strong etchant by itself can lead to an etching rate that is difficult to control, which can lead to additional damage as overetching can occur. As such, in order to help modify the etching rate of the wet etching solution 301, the weak alkali may be utilized. In a particular embodiment the weak alkali may be an alkali component with a large steric hindrance in order to buffer the wet etching solution and to replenish the OH$^-$ ions which are used up by the reaction with silicon (please see Equation 1 above). For example, utilizing embodiments with a large steric hindrance, the large steric hindrance will work to hinder the approach of the strong alkali towards the surface of the dummy gate electrode 111. By hindering, but not stopping the approach of the strong alkali, the weak alkali can help to modify the chemical reaction, causing the etching rate of the wet etching solution to be effectively controlled by the concentration of the weak alkali.

In particular embodiments, the weak alkali may be an alkali that is different from the strong alkali. As such, while the weak alkali is at least partially dependent upon the material chosen for the strong alkali, in embodiments in which the strong alkali is tetramethylammonium hydroxide or ammonium hydroxide, the weak alkali may be an amine such as monoethanolamine (MEA, with a volume of 100 Å$^3$/molecule), triethanolamine (TEA, with a volume of 220 Å$^3$/molecule), tetrabutylammonium hydroxide (TBAH), trimethylphenylammonium hydroxide, combinations of these, or the like. Additionally, in embodiments in which the strong alkali is not TMAH, the weak alkali may be TMAH (with a volume of 142 Å$^3$/molecule). These chemicals may have the following structures:

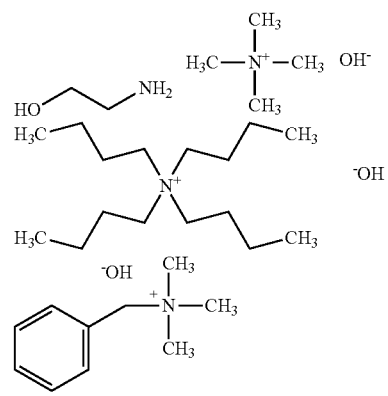

However, any suitable weak alkali may be utilized.

However, the usage of the etchants has a low selectivity between the material of the dummy gate electrode 111 (e.g., polysilicon) and the material of the source/drain regions 201 (e.g., SiP). As such, during the removal of the dummy gate electrode 111 while the wet etching solution 301 is in contact with the first spacers 113 and the dummy gate dielectric 109, the etchants of the wet etching solution 301 may diffuse (As represented by the arrow labeled 303) through the first spacers 113 and the dummy gate dielectric 109 and come into contact with the material of the source/drain regions 201. Such contact, given the low etchant selectivity between the material of the dummy gate electrode (e.g. polysilicon) and the material of the source/drain regions 201 (e.g., SiP), will damage the source/drain regions 201, causing the overall process window to be narrowed in order to avoid such damage.

As such, in order to help protect the material of the source/drain regions 201 (e.g., SiP), an oxidizer is added to the wet etching solution 301 which will selectively oxidize the material of the source/drain regions 201 (e.g., SiP). In an embodiment the oxidizer will diffuse along with the strong etchant through the first spacers 113 and also come into contact with the material of the source/drain regions 201. However, rather than damage the material of the source/drain regions 201, the oxidizer will work with the material of the source/drain regions 201 to form protective regions 305 within the source/drain regions 201 adjacent to the first spacers 113.

For example, in an embodiment the oxidizer will react with the material of the source/drain regions 201 (e.g., SiP) in order to form an oxide protective region 305. Such an oxide protective region 305 will work to slow down or prevent the diffusion of the etchants further into the source/drain regions 201 by providing a strong electron acceptor molecule in the form of a surface passivation through oxidation. By providing an electron acceptor molecule the electrons from the oxidation step will recombine with the electron acceptor and are subsequently unavailable for the subsequent reduction step. Such a reduction or prevention will work to reduce or eliminate the damage done to the source/drain regions 201 from the diffusion of the etchant.

As such, while the precise oxidizer utilized will be dependent at least in part on the material of the source/drain regions 201, in a particular embodiment in which the material of the source/drain regions 201 is SiP, the oxidizer may be an N-oxide derivative such as N-methylmorpholine N-oxide (NMMO—CAS No. 7529-22-8), 4-methylpyridine N-oxide (MPO), pyridine N-oxide, combinations of these, or the like. These chemicals may have the following structures:

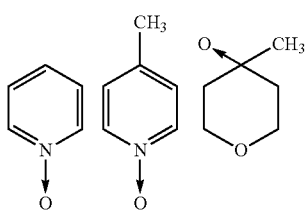

However, any suitable oxidizer may be utilized.

Additionally, and optionally, the wet etching solution 301 may also comprise other additives in order to help with the etching process. In one embodiment a surfactant may be utilized in order to enhance the wettability of the wet etching solution 301. For example, the wet etching solution 301 may be a glycol molecule with a bulky structure, such as ethyelene glycol, diethylene glycol, triethylene glycol, ethylene glycol butyl ether, carbitol, combinations of these, or the like. These surfactants may have the following structures:

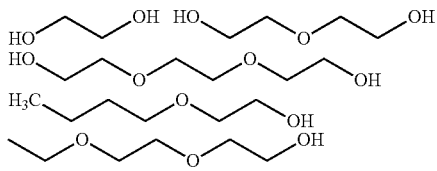

In an embodiment, the wet etching solution 301 may be formed by mixing each of the individual components into the solvents. For example, in some embodiments the strong alkali may be placed into the solvents at a concentration between about 0.5% and about 3%, such as about 1.3%, while the weak alkali is placed into the solvents at a concentration of between about 0.1% and about 20%, such as about 5%. Additionally, the oxidizer may be placed at a concentration of between about 5% and about 20%, such as between about 10% and about 15%. Finally, the solvent may be at a concentration of between about 49.55% and about 75%, such as between about 59.55% and about 70%, such as about 65% while the non-hydrocarbon solvent may be at a concentration of between about 18.45% and about 23.9%, such as about 18.9%. However, any suitable concentrations may be utilized.

In one particular embodiment, the oxidizer may be placed at a concentration of about 5%, the strong alkali may be placed at a concentration of about 1.3%, the weak alkali may be placed at a concentration of about 5%, the solvent may be placed at a concentration of about 70%, and the non-hydrocarbon solvent may be placed at a concentration of about 18.45%. Utilizing these concentrations, the etching rate of amorphous silicon is about 214 Å/min and the native oxide resistance is about 130 minutes. Additionally, the thickness of the protective region 305 is about 44.84 Å.

In another particular embodiment, the oxidizer may be placed at a concentration of about 10%, the strong alkali may be placed at a concentration of about 1.3%, the weak alkali may be placed at a concentration of about 5%, the solvent may be placed at a concentration of about 65%, and the non-hydrocarbon solvent may be placed at a concentration of about 18.45%. Utilizing these concentrations, the etching rate of amorphous silicon is about 152 Å/min and the native oxide resistance is about 270 minutes. Additionally, the thickness of the protective region 305 is about 230.19 Å.

In another particular embodiment, the oxidizer may be placed at a concentration of about 15%, the strong alkali may be placed at a concentration of about 1.3%, the weak alkali may be placed at a concentration of about 5%, the solvent may be placed at a concentration of about 59.55%, and the non-hydrocarbon solvent may be placed at a concentration of about 18.9%. Utilizing these concentrations, the etching rate of amorphous silicon is about 148 Å/min and the native oxide resistance is about 270 minutes. Additionally, the thickness of the protective region 305 is about 59.02 Å.

In another particular embodiment, the oxidizer may be placed at a concentration of about 20%, the strong alkali may be placed at a concentration of about 1.3%, the weak alkali may be placed at a concentration of about 5%, the solvent may be placed at a concentration of about 49.55%, and the non-hydrocarbon solvent may be placed at a concentration of about 23.9%. Utilizing these concentrations, the etching rate of amorphous silicon is about 173 Å/min and the native oxide resistance is about 250 minutes. Additionally, the thickness of the protective region 305 is about 0.34 Å.

For comparison purposes, a wet etching solution utilizing TMAH by itself at a concentration of 1.3% has an etch rate of about 976 Å/min and the native oxide resistance is about 5 minutes. Additionally, in an embodiment in which the oxidizer is not utilized, the strong alkali is placed at a concentration of about 1.3%, the weak alkali is placed at a concentration of about 5%, the solvent is placed at a concentration of about 75%, and the non-hydrocarbon solvent is placed at a concentration of about 18.45%, the etching rate of amorphous silicon is about 230 Å/min, the native oxide resistance is about 120 minutes, and the thickness of the protective region 305 is about 0.41 Å. By utilizing an etching rate between about 148 Å/min and about 214 Å/min, the etching rate of the amorphous silicon can be high enough to allow for an effective removal while still allowing for an improved resistance where needed.

Once the wet etching solution 301 has been prepared, the wet etching solution may be placed into contact with the material of the dummy gate electrode 111. In an embodiment the wet etching solution 301 may be placed into contact with the material of the dummy gate electrode 111 by dipping the structure comprising the material of the dummy gate electrode 111 into a pool of the wet etching solution 301 in a dip method. However, any other suitable process of contacting the wet etching solution 301 with the material of the dummy gate electrode 111, such as puddle processes, spray-on processes, combinations of these, or the like, may be utilized.

Additionally, the wet etching process utilizing the wet etching solution 301 may be performed at a temperature of between about 25° C. and about 70° C., such as about 50° C. Further, the wet etching process may be continued until the material of the dummy gate electrode 111 (e.g., amorphous silicon) is removed and the dummy gate dielectric 109 is exposed, such as between about 120 seconds and about 600 seconds, such as about 360 seconds. However, any suitable temperature and time may be utilized.

During the wet etching process utilizing the wet etching solution 301, the wet etching solution 301 will remove the material of the dummy gate electrode 111. Additionally, during the wet etching process the wet etching solution 301 will diffuse through the dummy gate dielectric 109 and come into contact with the source/drain region 201. However, with the presence of the oxidizer (e.g., NMMO), the material of the source/drain region 201 (e.g., SiP) will react with the oxidizer to form the protective region 305, such as oxidizing the material of the source/drain region 201. Such a protective region 305 will work to prevent additional diffusion of the remainder of the components within the wet etching solution 301 and causing additional damage.

In a particular embodiment the protective region 305 may be formed along the interface between the dummy gate dielectric 109 and the source/drain region 201. For example, the protective region 305 may extend away from the dummy gate dielectric 109 and have a second thickness $T_2$ of between about 10 Å and about 50 Å, such as about 20 Å. However, any suitable thickness may be utilized.

Figure 4A:
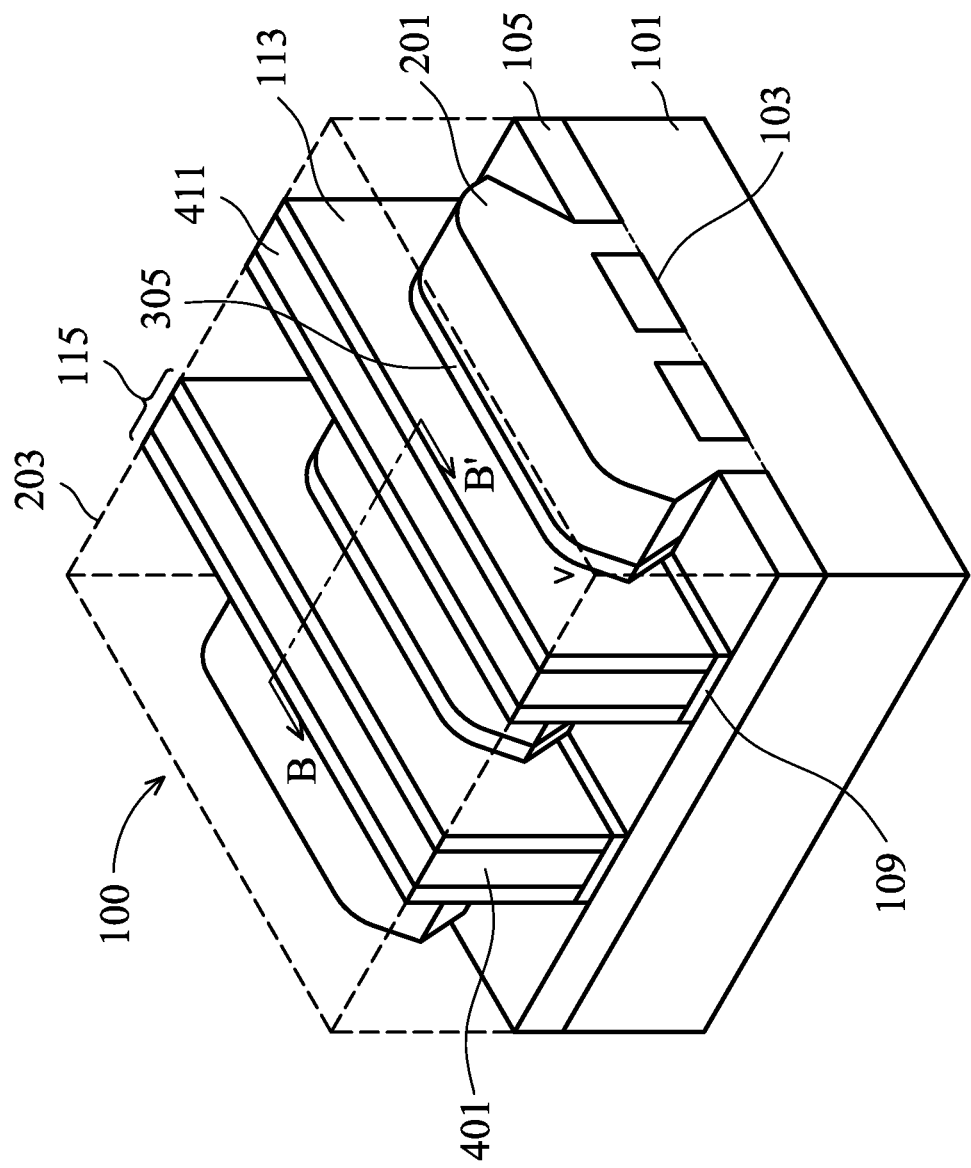
FIGS. 4A-4B illustrate a formation of a replacement gate, in accordance with some embodiments.
Figure 4B:
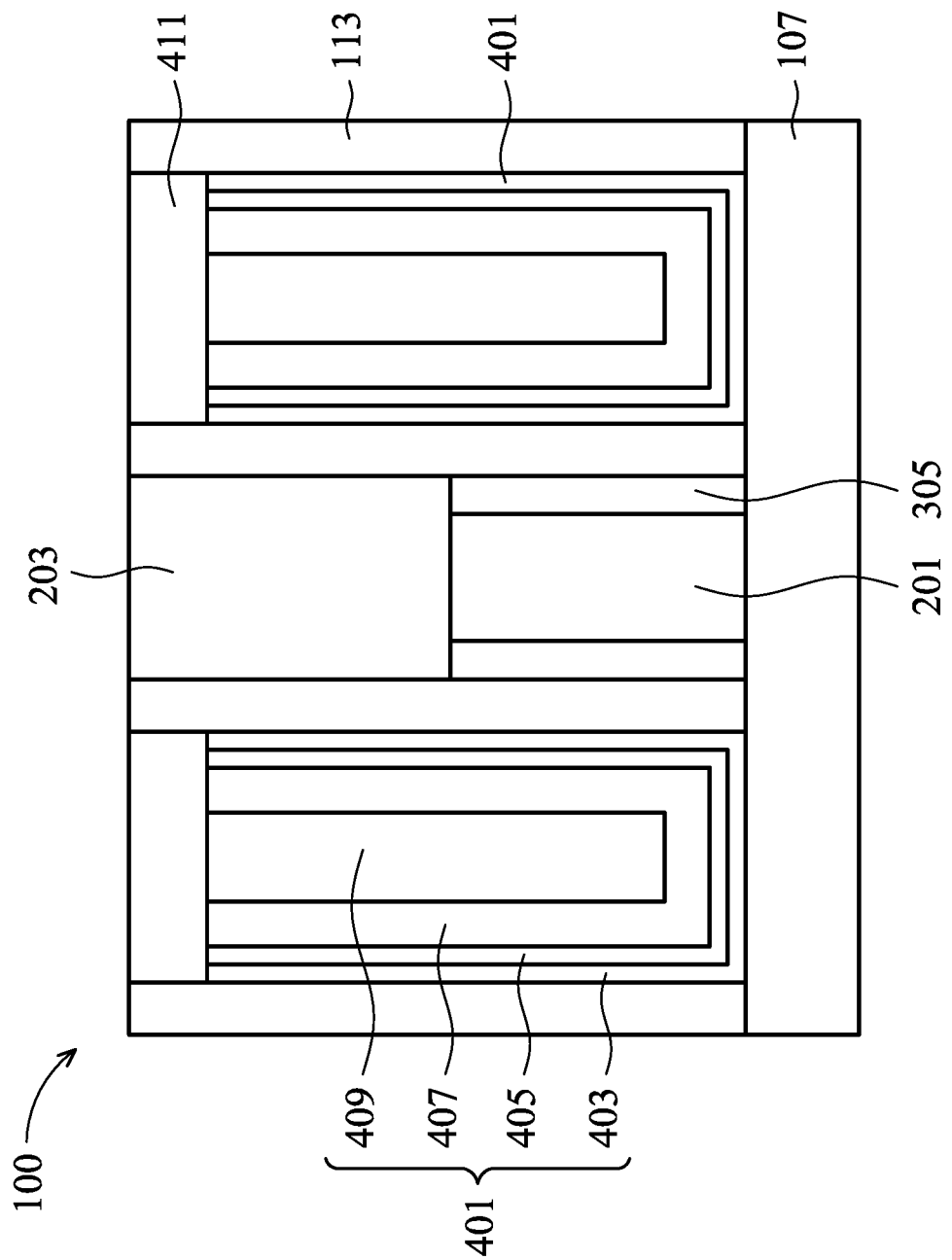

FIGS. 4A-4B illustrate that, once the wet etching solution 301 has been utilized to remove the material of the dummy gate electrode 111 (e.g., polysilicon), the openings left behind may be refilled to form the gate stack 401 (with FIG. 4B being a cross-sectional view of FIG. 4A along line B-B'). Optionally, if desired, the exposed portions of the dummy gate dielectric 109 may be removed using, e.g., a wet etching process with an etchant selective to the material of the dummy gate electrode 111. However, any suitable removal process may be utilized.

Once the dummy gate electrode 111 has been removed, the gate stack 401 may be deposited. In a particular embodiment the gate stack 401 comprises a first dielectric material 403, a first metal material 405, a second metal material 407, and a third metal material 409. In an embodiment the first dielectric material 403 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 403 may be deposited to a thickness of between about 5 Å and about 200 Å, although any suitable material and thickness may be utilized.

The first metal material 405 may be formed adjacent to the first dielectric material 403 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 405 may be deposited using a deposition process such as atomic layer deposition, chemical vapor deposition, sputtering, or the like, to a thickness of between about 5 Å and about 200 Å, although any suitable deposition process or thickness may be used.

The second metal material 407 may be formed adjacent to the first metal material 405 and, in a particular embodiment, may be similar to the first metal material 405. For example, the second metal material 407 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material 407 may be deposited using a deposition process such as atomic layer deposition, chemical vapor deposition, sputtering, or the like, to a thickness of between about 5 Å and about 200 Å, although any suitable deposition process or thickness may be used.

The third metal material 409 fills a remainder of the opening left behind by the removal of the dummy gate electrode 111. In an embodiment the third metal material 409 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material 409 may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

After the materials of the gate stack 401 have been formed and planarized, the materials of the gate stack 401 may be recessed and capped with a capping layer 411. In an embodiment the materials of the gate stack 401 may be recessed using, e.g., a wet or dry etching process that utilizes etchants selective to the materials of the gate stack 401. In an embodiment the materials of the gate stack 401 may be recessed a distance of between about 5 nm and about 150 nm, such as about 120 nm. However, any suitable process and distance may be utilized.

Once the materials of the gate stack 401 have been recessed, the capping layer 411 may be deposited and planarized with the first spacers 113. In an embodiment the capping layer 411 is a material such as SiN, SiON, SiCON, SiC, SiOC, combinations of these, or the like, deposited using a deposition process such as atomic layer deposition, chemical vapor deposition, sputtering, or the like. The capping layer 411 may be deposited to a thickness of between about 5 Å and about 200 Å, and then planarized using a planarization process such as chemical mechanical polishing such that the capping layer 411 is planar with the first spacers 113.

Additionally, after the gate stack 401 has been completed, additional processing may be performed. For example, conductive contacts may be formed to make contact with the gate stack 401 and the source/drain regions 201, and additional metallization layers may be formed over the gate stack 401 and the source/drain regions 201. However, any suitable additional processing may be performed.

In accordance with an embodiment, a method of manufacturing a semiconductor device includes forming a dummy gate electrode over a semiconductor fin; removing the dummy gate electrode from over the semiconductor fin with a first etching solution, the first etching solution comprising: a solvent; a first etchant within the solvent; and an oxidizer within the solvent. In an embodiment, the oxidizer is N-methylmorpholine N-oxide. In an embodiment, the first etchant comprises: a strong alkali; and a weak alkali. In an embodiment, the strong alkali is tetramethylammonium hydroxide. In an embodiment, the weak alkali is monoethanolamine. In an embodiment, the solvent comprises ethylene glycol. In an embodiment, the first etching solution further comprises a non-hydrocarbon solvent.

In accordance with another embodiment, a method of manufacturing a semiconductor device includes depositing a dummy gate dielectric adjacent to a semiconductor fin; depositing a dummy gate electrode adjacent to the semiconductor fin; depositing a spacer adjacent to the dummy gate dielectric; replacing a portion of the semiconductor fin with a source/drain region; and diffusing an oxidizer through the dummy gate dielectric to form a protective region from a portion of the source/drain region. In an embodiment, the protective region has a thickness of between about 10 Å and about 50 Å. In an embodiment, the protective region comprising an oxide of silicon phosphorous. In an embodiment, the oxidizer is applied to the dummy gate dielectric in a wet etching solution. In an embodiment, the wet etching solution diffuses through the dummy gate electrode to make contact with the source/drain region. In an embodiment, the wet etching solution removes the dummy gate electrode at a rate of between about 148 Å/min and about 214 Å/min. In an embodiment, the wet etching solution removes the dummy gate electrode at a rate of about 152 Å/min.

In accordance with yet another embodiment, a method of manufacturing a semiconductor device includes forming an epitaxial region adjacent to a semiconductor fin; and applying a wet etching solution to an amorphous silicon region over the semiconductor fin, wherein an oxidizer within the wet etching solution diffuses through a dielectric material to react with the epitaxial region and reduce a diffusion of etchants into the epitaxial region. In an embodiment, the epitaxial region comprises SiP. In an embodiment, the reaction with the epitaxial region creates a protective layer has a thickness of between about 0.1 nm and about 5 nm. In an embodiment, the oxidizer comprises pyridine N-oxide. In an embodiment, the wet etching solution further includes a strong alkali at a first concentration of about 1.3%; a weak alkali at a second concentration of about 5%; a solvent at a third concentration of between about 49.55% and about 75%; and a non-hydrocarbon solvent at a fourth concentration of between about 18.45% and about 23.9%. In an embodiment, the oxidizer is at a concentration of about 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a dummy gate electrode over a semiconductor fin;
    removing the dummy gate electrode from over the semiconductor fin with a first etching solution, the first etching solution comprising:
        a solvent;
        a first etchant within the solvent, the first etchant comprising a strong alkali and a weak alkali; and
        an oxidizer within the solvent.
2. The method of claim 1, wherein the oxidizer is N-methylmorpholine N-oxide.
3. The method of claim 1, wherein the strong alkali is tetramethylammonium hydroxide.
4. The method of claim 3, wherein the weak alkali is monoethanolamine.
5. The method of claim 1, wherein the solvent comprises ethylene glycol.
6. The method of claim 5, wherein the first etching solution further comprises a non-hydrocarbon solvent.

7. A method of manufacturing a semiconductor device, the method comprising:
    forming a dummy gate electrode over a semiconductor fin; and
    removing the dummy gate electrode from over the semiconductor fin with a first etching solution, the first etching solution diffusing through the dummy gate electrode to form a protective region on a portion of a source/drain region, the first etching solution comprising:
        a solvent;
        a first etchant within the solvent, the first etchant comprising a strong alkali and a weak alkali; and
        an oxidizer within the solvent.
8. The method of claim 7, wherein the strong alkali is tetramethylammonium hydroxide.
9. The method of claim 8, wherein the weak alkali is monoethanolamine.
10. The method of claim 7, further comprising:
    depositing a dummy gate dielectric adjacent to the semiconductor fin;
    depositing a spacer adjacent to the dummy gate dielectric; and
    replacing a portion of the semiconductor fin with the source/drain region.
11. The method of claim 10, wherein the first etching solution further diffuses through the spacer.
12. The method of claim 11, wherein the protective region comprises an oxide of silicon phosphorous.
13. The method of claim 10, wherein the oxidizer comprises an N-oxide derivative.
14. The method of claim 10, wherein the first etching solution further comprises a surfactant.
15. A method of manufacturing a semiconductor device, the method comprising:
    forming a dummy gate electrode over a semiconductor fin;
    forming an epitaxial region adjacent to the semiconductor fin; and
    removing the dummy gate electrode from over the semiconductor fin with a first etching solution, wherein the first etching solution diffuses through the dummy gate electrode to react with the epitaxial region, the first etching solution comprising:
        a solvent;
        a first etchant within the solvent, the first etchant comprising a strong alkali and a weak alkali; and
        an oxidizer within the solvent.
16. The method of claim 15, wherein the first etching solution reacting with the epitaxial region forms a protective layer on the epitaxial region.
17. The method of claim 16, wherein the protective layer has a thickness of between about 10 Å and about 50 Å.
18. The method of claim 16, wherein the protective layer reduces a diffusion of the first etchant into the epitaxial region.
19. The method of claim 15, wherein the oxidizer comprises an N-oxide derivative.
20. The method of claim 15, further comprising:
    depositing a dummy gate dielectric adjacent to the semiconductor fin, wherein the dummy gate electrode comprises an amorphous silicon region disposed over the dummy gate dielectric;
    depositing a spacer adjacent to the dummy gate dielectric; and
    replacing a portion of the semiconductor fin with the epitaxial region.

21. The method of claim 15, wherein the solvent comprises a glycol.

* * * * *